(12) United States Patent
Kurihara et al.

(10) Patent No.: US 9,142,749 B2
(45) Date of Patent: Sep. 22, 2015

(54) THERMOELECTRIC CONVERSION MODULE

(75) Inventors: Kazuaki Kurihara, Kawasaki (JP); Takuya Nishino, Kawasaki (JP); Takashi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 719 days.

(21) Appl. No.: 13/307,377

(22) Filed: Nov. 30, 2011

(65) Prior Publication Data

US 2012/0211044 A1 Aug. 23, 2012

(30) Foreign Application Priority Data

Feb. 22, 2011 (JP) .................. 2011-036437

(51) Int. Cl.
*H01L 31/16* (2006.01)
*H01L 35/16* (2006.01)
*H01L 35/32* (2006.01)

(52) U.S. Cl.
CPC ............... *H01L 35/16* (2013.01); *H01L 35/32* (2013.01)

(58) Field of Classification Search
None
See application file for complete search history.

(56) References Cited

U.S. PATENT DOCUMENTS

| 5,209,786 | A * | 5/1993 | Rolfe et al. ............ 136/211 |
| 2005/0210883 | A1 * | 9/2005 | Bell .................. 62/3.2 |
| 2006/0075761 | A1 * | 4/2006 | Kitchens et al. ........ 62/3.64 |
| 2006/0105222 | A1 * | 5/2006 | Abd Elhamid et al. ..... 429/38 |
| 2009/0084423 | A1 * | 4/2009 | Horio ................. 136/241 |
| 2010/0005572 | A1 * | 1/2010 | Chaplin .................. 2/411 |
| 2010/0132930 | A1 * | 6/2010 | Izenson et al. .......... 165/168 |

FOREIGN PATENT DOCUMENTS

| JP | 7-111345 | | 4/1995 |
| JP | 10-111368 | | 4/1998 |
| JP | 10-239461 | | 9/1998 |
| JP | 2003-174203 | A1 | 6/2003 |
| JP | 2003189647 | A | 7/2003 |
| JP | 2003-258323 | A1 | 9/2003 |

OTHER PUBLICATIONS

Wang Z et al "Realization of a wearable miniaturized thermoelectric generator for human body applications" Sensors and Actuators A: Physical vol. 156, p. 95-102 (2009).*
Japanese Office Action dated Aug. 19, 2014; Patent Application No. 2011-036437.

* cited by examiner

*Primary Examiner* — Jennifer Michener
*Assistant Examiner* — Christopher Danicic
(74) *Attorney, Agent, or Firm* — Kratz, Quintos & Hanson, LLP

(57) ABSTRACT

A thermoelectric conversion module includes: a first substrate having water permeability and thermal conductivity; a thermoelectric conversion element provided on the first substrate; a heat insulator having water permeability provided around the thermoelectric conversion element on the first substrate; and a second substrate disposed on the thermoelectric conversion element and the heat insulator and having water permeability and thermal conductivity.

8 Claims, 4 Drawing Sheets

THERMOELECTRIC CONVERSION MODULE

CROSS-REFERENCE TO RELATED APPLICATION

This application is based upon and claims the benefit of priority from the prior Japanese Patent Application No. 2011-36437 filed on Feb. 22, 2011, the entire contents of which are incorporated herein by reference.

FIELD

The embodiments discussed herein are related to a thermoelectric conversion module which converts thermal energy to electric energy.

BACKGROUND

In recent years, thermoelectric conversion elements have drawn attention from the viewpoint of a reduction in $CO_2$ and environmental protection. The use of the thermoelectric conversion elements allows conversion of thermal energy, which has been discarded until now to electric energy for reuse thereof. With one thermoelectric conversion element, the output voltage is low. Therefore, a plurality of thermoelectric conversion elements are usually connected in series to be used as the thermoelectric conversion module.

A general thermoelectric conversion module has a structure in which a large number of semiconductor blocks containing a p-type thermoelectric conversion material (hereinafter p-type semiconductor blocks) and a large number of semiconductor blocks containing an n-type thermoelectric conversion material (hereinafter n-type semiconductor blocks) are sandwiched between two heat exchanger plates. The p-type semiconductor blocks and the n-type semiconductor blocks are alternately arranged in the in-plane direction of the heat exchanger plates, and are connected in series with metal terminals disposed between the semiconductor blocks. Extraction electrodes are connected to both the ends of the semiconductor blocks connected in series.

The thermoelectric conversion module having such a structure has a structure such that a plurality of thermoelectric conversion elements each contains one p-type semiconductor block, one n-type semiconductor block, and terminals connecting the same are connected in series. The thermoelectric conversion element constituted by one p-type semiconductor block, one n-type semiconductor block, and terminals connect the same are connected in series is referred to as a π type thermoelectric conversion element in terms of the form.

In the above-described thermoelectric conversion module, when a temperature difference is given to the two heat exchanger plates, a potential difference occurs in each of the p-type semiconductor blocks and the n-type semiconductor blocks due to the Seebeck effect, and electric power may be extracted from the extraction electrode. The thermoelectric conversion module has been expected to be applied as, for example, wireless sensor nodes constituting sensor networks or the power supply source of various kinds of micro electric power electronic devices. As one of such applications, it has been considered to utilize the thermoelectric conversion module as the power supply of wearable electronic devices by attaching the thermoelectric conversion module to a human body, and generating electricity by differences in the body temperature and the outside air temperature. However, in such a use, there is a problem that when a temperature difference is small and particularly when the outside air temperature is high, sufficient output is not obtained.

A thermoelectric conversion module is known which utilizes the heat of vaporization of sweat supposing that the thermoelectric conversion module is attached to a human body. In such a thermoelectric conversion module, a film-like thermoelectric material is disposed on a plane, sweat is led to the front surface of the thermoelectric conversion module from the back surface thereof through a penetration hole formed in the bottom of an electrode portion, and the sweat is evaporated in the electrode portion, whereby a temperature difference is given to the thermoelectric material by a cooling effect due to the evaporation latent heat to generate electricity.

The followings are reference documents.
[Document 1] Japanese Laid-open Patent Publication No. 07-111345

SUMMARY

According to an aspect of the embodiment, a thermoelectric conversion module includes a first substrate having water permeability and thermal conductivity, a thermoelectric conversion element provided on the first substrate a heat insulator having water permeability provided around the thermoelectric conversion element on the first substrate; and a second substrate disposed on the thermoelectric conversion element and the heat insulator and having water permeability and thermal conductivity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferable embodiments relating to the disclosed technique are described in detail below with reference to the accompanied drawings.

Figure 1:
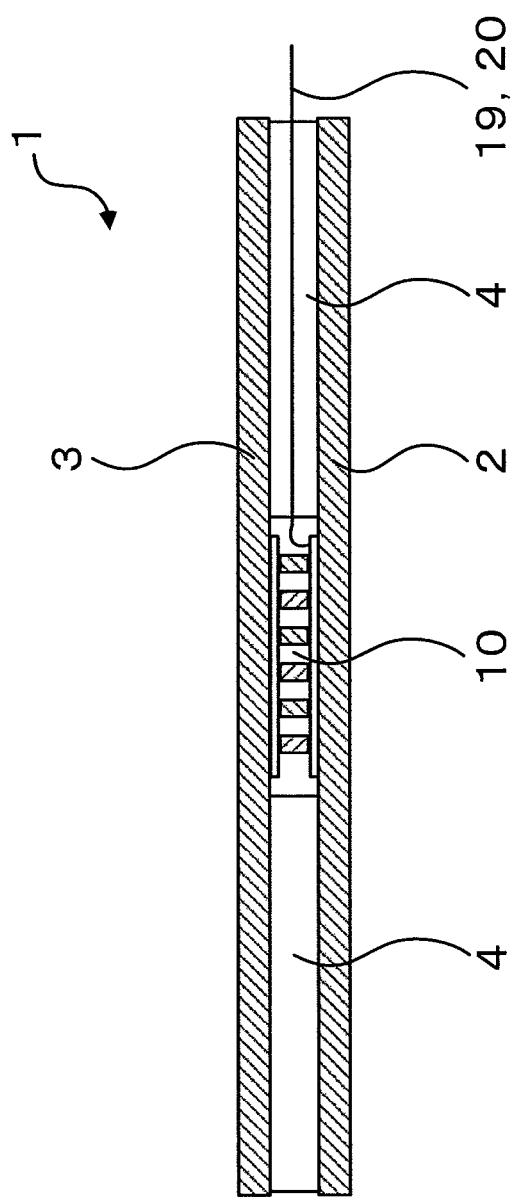
FIG. 1 is a cross sectional view of a thermoelectric conversion module of a first embodiment.

FIG. 1 illustrates a cross sectional view of a thermoelectric conversion module according to a first embodiment to which the disclosed technique is applied. A thermoelectric conversion module 1 according to the first embodiment has a structure in which a thermoelectric conversion element 10 is sandwiched between a heat absorbing plate 2 and a heat dissipating plate 3 from the upper and lower sides. Between the heat absorbing plate 2 and the heat dissipating plate 3, a heat insulator 4 is disposed around the thermoelectric conversion element 10. Lead wires 19 and 20 for extracting the current generated from the thermoelectric conversion element 10 pass through the inside of the heat insulator 4 to be led to the outside from the end portion of the heat insulator 4. For the heat absorbing plate 2, a material excellent in the thermal conductivity, such as a copper plate having a size of 30×30 mm and a thickness of several 100 micrometers, is mentioned, for example. Since the thickness of the heat absorbing plate 2 is reduced to be very thin, flexibility is imparted.

Figure 2:
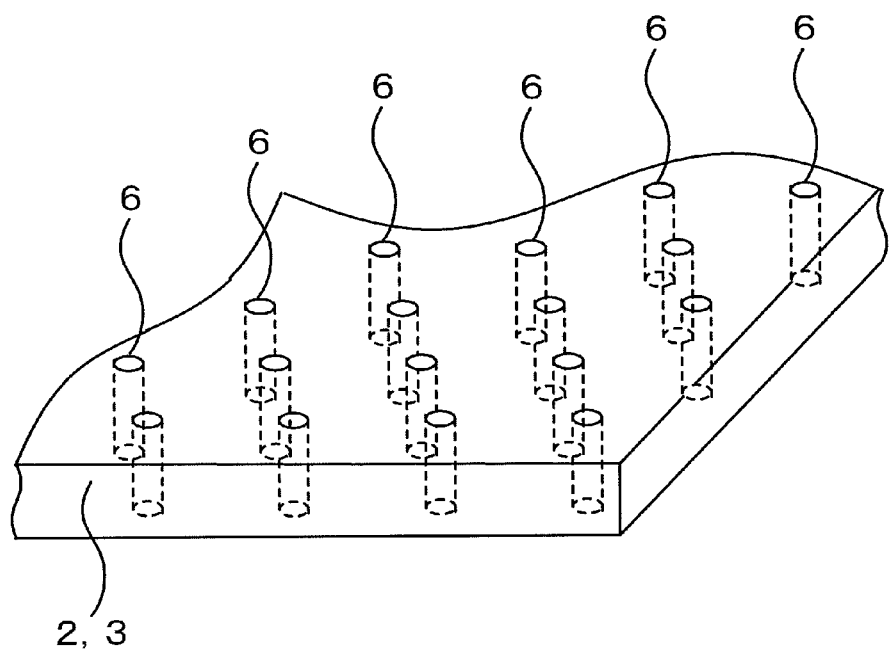
FIG. 2 is a perspective diagram of a heat absorbing plate and a heat dissipating plate.

FIG. 2 illustrates a perspective view of the surface of the heat absorbing plate 2 and the heat dissipating plate 3. As illustrated in FIG. 2, both the heat absorbing plate 2 and the heat dissipating plate 3 has a plurality of minute penetration holes 6 having a diameter of about 50 micrometers formed therein in the vertical direction, and the entire surface including the inner wall of the penetration holes 6 are hydrophilized. The hydrophilization is performed by applying a hydrophilic coating material, such as 3-hydroxypropyl acrylate, to the surface of the heat absorbing plate 2 and the heat dissipating plate 3 and the inner wall of the penetration hole 6s, for example. Alternatively, a hydrophilic effect is also obtained by subjecting the surface of the heat absorbing plate 2 and the heat dissipating plate 3 and the inner wall of the penetration hole 6 to plasma treatment to form OH groups thereon.

Figure 3A:
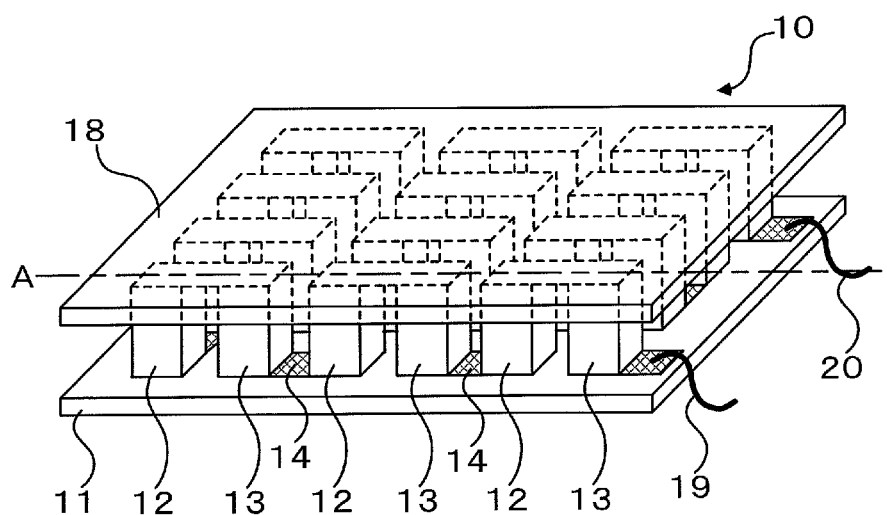
FIG. 3A is a perspective view of a thermoelectric conversion element and FIG. 3B is a cross sectional view thereof.
Figure 3B:
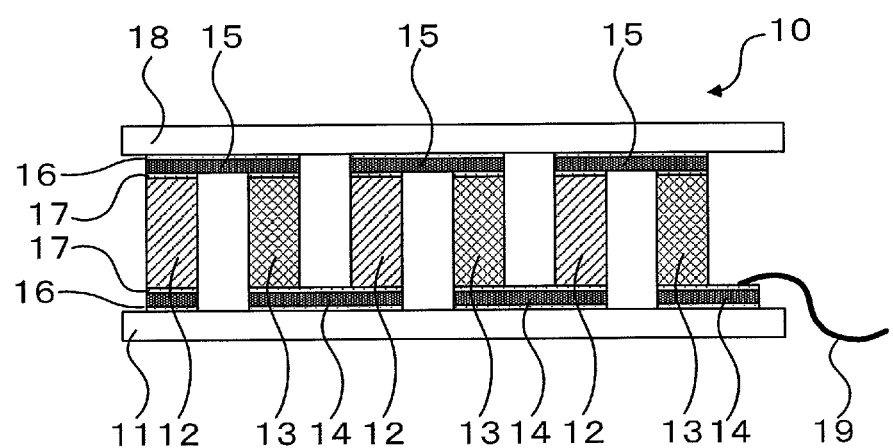

FIG. 3A is a perspective view of the thermoelectric conversion element 10. FIG. 3B is a cross sectional view of the thermoelectric conversion element 10 along the IIIB-IIIB line of FIG. 3A. The thermoelectric conversion element 10 have a structure in which a plurality of p-type semiconductor blocks 12 and a plurality of n-type semiconductor blocks 13 are sandwiched between a lower substrate 11 and an upper substrate 18 from the upper and lower sides. For the lower substrate 11, an insulating substrate, such as alumina, is used, for example. On the lower substrate 11, the plurality of p-type semiconductor blocks 12 and the plurality of n-type semiconductor blocks 13 are alternately arranged.

The p-type semiconductor block 12 is a semiconductor block containing a p-type thermoelectric conversion material. The n-type semiconductor block 13 is a semiconductor block containing an n-type thermoelectric conversion material. In a pair of the p-type semiconductor blocks 12 and the n-type semiconductor block 13 adjacent to each other, the lower end of each semiconductor block facing the lower substrate 11 is electrically connected by a lower electrode 14. In the p-type semiconductor blocks 12 of the pair of the p-type semiconductor block 12 and the n-type semiconductor block 13 adjacent to each other, the upper end facing upper substrate 18 is electrically connected, by an upper electrode 15, to the upper end facing the upper substrate 18 side of one n-type semiconductor block 13 of another pair of the p-type semiconductor blocks 12 and the n-type semiconductor block 13.

Similarly, in the other n-type semiconductor block 13 of the p-type semiconductor blocks 12 and the n-type semiconductor blocks 13 adjacent to each other, the upper end facing the upper substrate 18 is electrically connected, by the upper electrode 15, to the upper end facing the upper substrate 18 side of one p-type semiconductor block 12 of another pair of the p-type semiconductor blocks 12 and the n-type semiconductor block 13.

The lower electrode 14 and the lower substrate 11 are bonded using a bonding member 16, such as a firing paste, for example. Similarly, the upper electrode 15 and the upper substrate 18 are bonded using the bonding member 16, such as a firing paste, for example.

The lower electrode 14 is bonded to the p-type semiconductor block 12 and the n-type semiconductor block 13, using the bonding member 17, such as a solder, for example. Similarly, the upper electrode 15 is bonded to the p-type semiconductor block 12 and the n-type semiconductor block 13, using the bonding member 17, such as a solder, for example.

Thus, the plurality of p-type semiconductor blocks 12 and the plurality of n-type semiconductor blocks 13 are arranged above the upper substrate 11 in such a manner that the p-type blocks and the n-type blocks are alternately arranged, and the blocks are connected in series through the lower electrode 14 and the upper electrode 15. On the end of the series circuit constituted by the p-type semiconductor block 12, the n-type semiconductor block 13, the lower electrode 14, and the upper electrode 15, the lead wires 19 and 20 for extracting the current from the series circuit are provided.

In a state where the thermoelectric conversion element 10 is installed in the thermoelectric conversion module 1, the space between the p-type semiconductor block 12 and the n-type semiconductor block 13 between the lower substrate 11 and the upper substrate 18 contains air, so that a heat insulating effect is imparted. Alternatively, in order to prevent the p-type semiconductor block 12, the n-type semiconductor block 13, the lower electrode 14, and the upper electrode 15 from being exposed to the moisture from the heat insulator 4 and deteriorated, the space may be sealed with resin or the like having heat insulating properties and insulation properties.

For the upper substrate 11 and the lower substrate 18 of the thermoelectric conversion elements 10, ceramic substrates, such as aluminum nitride (AlN), in addition to alumina (aluminum oxide, AlO) may be used and metals (a copper alloy, an aluminum alloy, and the like) whose surface is thinly coated with insulating films, such as alumina, silicon oxide, and glass, may also be used.

For the p-type semiconductor blocks 12 and the n-type semiconductor blocks 13, BiTe-based p-type semiconductors and n-type semiconductors may be used, respectively, for example. For the p-type semiconductor, bismuth.antimony.tellurium (Bi0.5Sb1.5Te3) may be used, for example. For the n-type semiconductor, bismuth.tellurium.selenium (Bi2Te2.85Se0.15) may be used, for example.

For the lower electrode 14 and the upper electrode 15, copper (Cu) or one mainly containing Cu may be used, for example.

For the bonding member 17, a bismuth (Bi)-tin (Sn) alloy solder (Bi: 58%, Sn: 42%) or one mainly containing the alloy solder concerned may be used, for example. In this case, on the end surface of the p-type semiconductor block 12 and the n-type semiconductor block 13, a nickel (Ni) plating may be formed in order to increase the wettability with the solder and the adhesion with the solder.

For example, the thermoelectric conversion element 10 having a size of 5×5×2 mm is disposed near the center of the heat absorbing plate 2, and connected to the heat absorbing plate 2 by a solder. Around the side surface of the thermoelectric conversion element 10, the heat insulator 4 having water permeability, such as hydrophilic porous polyethylene, is disposed, for example. On the thermoelectric conversion element 10 and the heat insulator 4, the heat dissipating plate 3 having, for example, a size of 30×30 mm and a thickness of several 100 micrometers is disposed, and is connected to the thermoelectric conversion element 10 by a solder. Mentioned as the material of the heat dissipating plate 3 is, for example, a material excellent in thermal conductivity, such as a copper plate. Similarly as in the heat absorbing plate 2, the thickness of the heat dissipating plate 3 is reduced to be very thin, and therefore flexibility is imparted.

By attaching the thermoelectric conversion module 1 according to the first embodiment to the human arm, the temperature of the lower substrate 11 of the thermoelectric conversion element 10 becomes almost equivalent to the body temperature because the body temperature is transmitted through the heat absorbing plate 2. The temperature of the upper substrate 18 of the thermoelectric conversion element 10 becomes almost equivalent to the outside air through the heat dissipating plate 3. Therefore, the temperature of the end portion of the p-type semiconductor block 12 and the n-type semiconductor block 13 sandwiched between the lower substrate 11 and the upper substrate 18 becomes almost equivalent to the body temperature because the heat is transmitted from the lower substrate 11. The heat is transmitted from the upper substrate 18 to the upper end portion of the p-type semiconductor block 12 and the n-type semiconductor block 13, and the temperature thereof becomes almost equivalent to the outside air.

When a difference in temperature occurs between the lower end portion and the upper end portion of the p-type semiconductor block 12 and the n-type semiconductor block 13, free electrons move in the p-type semiconductor block 12 and the n-type semiconductor block 13. The materials are different from each other between the p-type semiconductor block 12 and the n-type semiconductor block 13. Therefore, the mobility of the free electrons in the p-type semiconductor block 12 and the mobility of the free electrons in the n-type semiconductor block 13 are also different from each other. Then, the lead wires 19 and 20 at the end of the series circuit constituted by the p-type semiconductor blocks 12, the n-type semiconductor blocks 13, the lower electrodes 14, and the upper electrodes 15 are connected to thereby constitute a loop circuit. As a result, a current flows in a fixed direction due to the difference in the mobility of the free electrons in the p-type semiconductor blocks 12 and the mobility of the free electrons in the n-type semiconductor blocks 13. This phenomenon is referred to as the Seebeck effect.

With the movement of the free electrons, heat conduction also occurs. Therefore, the heat of the heat absorbing plate 2 is transmitted to the heat dissipating plate 3 through the lower substrate 11, the p-type semiconductor blocks 12, the n-type semiconductor blocks 13, and the upper substrate 18 of the thermoelectric conversion element 10 to be emitted from the heat dissipating plate 3.

The thickness of each of the heat absorbing plate 2 and the heat dissipating plate 3 is extremely thin, and thus flexibility is imparted. Since the heat insulator 4 inserted between them also has flexibility, the entire thermoelectric conversion module 1 has flexibility. Therefore, the thermoelectric conversion module 1 may be closely attached to the human body surface. Therefore, the body temperature may be efficiently supplied to the thermoelectric conversion element 10 to thereby generate electricity. Moreover, in the first embodiment, the size of the heat absorbing plate 2 and the heat dissipating plate 3 is 30×30 mm, so that the area is 36 times the size of 5×5 mm of the thermoelectric conversion element 10. Therefore, the body temperature absorbed by the heat absorbing plate 3 may be efficiently transmitted to the thermoelectric conversion element 10 and may be efficiently radiated by the heat dissipating plate 3.

When sweating, the moisture in the sweat is sucked up into the penetration holes of the heat absorbing plate 2 due to capillarity, and further permeates into the heat insulator 4 having hydrophilicity. The moisture permeating into the heat insulator 4 having hydrophilicity is further sucked up into the penetration holes 6 of the heat dissipating plate 3 due to capillarity to be led to the surface of the heat dissipating plate 3, and may be evaporated from the surface of the heat dissipating plate 3. Then, the heat of vaporization is removed from the heat dissipating plate 3, so that the temperature of the heat dissipating plate 3 decreases. As a result, a difference in the temperature of both the ends of the p-type semiconductor block 12 and the n-type semiconductor block 13 becomes large, so that the movement degree of the free electrons in each semiconductor block increases. It is a matter of course that a difference in the mobility of the free electrons in the p-type semiconductor block 12 and the mobility of the free electrons in the n-type semiconductor block 13 also becomes large, so that a current flowing into a loop circuit also increases. The heat absorbing plate 2 having the penetration holes 6, the heat dissipating plate 3 having the penetration holes 6, and the heat insulator 4 have water permeability. The heat absorbing plate 2, the heat insulator 4, and the heat dissipating plate 3 increase the electric power generated by the thermoelectric conversion element 10. The moisture in sweat is led to the surface of the heat dissipating plate 3 through the heat insulator 4 having hydrophilicity. Therefore, the thermoelectric conversion element 10 is not exposed to the moisture in sweat. Therefore, the electrode of the thermoelectric conversion element 10 is not corroded by the salt in the sweat, and the power generation performance does not deteriorate.

As a Comparative Example, a thermoelectric conversion module was produced which uses a thermoelectric conversion element equivalent to the thermoelectric conversion element 10 of the first embodiment for the thermoelectric conversion element and uses a foamed polyethylene not having water permeability for the heat insulator. Then, the thermoelectric conversion module is attached to the human arm, and the power generation output was measured. As a result, in a standstill state at a temperature of 20° C., a difference was hardly observed between the first embodiment and the Comparative Example. However, the difference in the power generation output arose as follows: in a standstill state at a temperature of 30° C., the power generation output of the first embodiment was about twice that of the Comparative Example, in light exercise, such was walking, the power generation output of the first embodiment was about three times that of the Comparative Example, and in intense exercise, the power generation output of the first embodiment was about ten times that of the Comparative Example.

As the materials of the heat absorbing plate 2 and the heat dissipating plate 3, materials having high thermal conductivity are suitable, and aluminum, an aluminum alloy, a graphite sheet, and the like may be used in addition to Cu. Moreover, since the heat conduction of the in-plane direction is important, a laminate of the highly thermally-conductive material mentioned above and a low heat conduction material, such as resin, may be acceptable.

The heat absorbing plate 2 and the heat dissipating plate 3 in which the penetration holes 6 are formed may be replaced by other means having a function of penetrating moisture. For example, the heat absorbing plate 2 and the heat dissipating plate 3 may be entirely constituted by a porous sintered compact in which metal particles are sintered, one in which metal or carbon fibers are hardened, or one in which metal or carbon fibers are woven. However, the thermal conductivity considerably decreases when the porosity is extremely high. Therefore, it is important to balance the water permeability and the thermal conductivity.

For the heat insulator 4, materials having small thermal conductivity are suitable, and various kinds of resin may be utilized in addition to polyethylene. In order to lower the thermal conductivity, minute cavities which do not vertically penetrate may be formed in addition to the cavities which allow moisture to pass and vertically penetrate.

Figure 4:
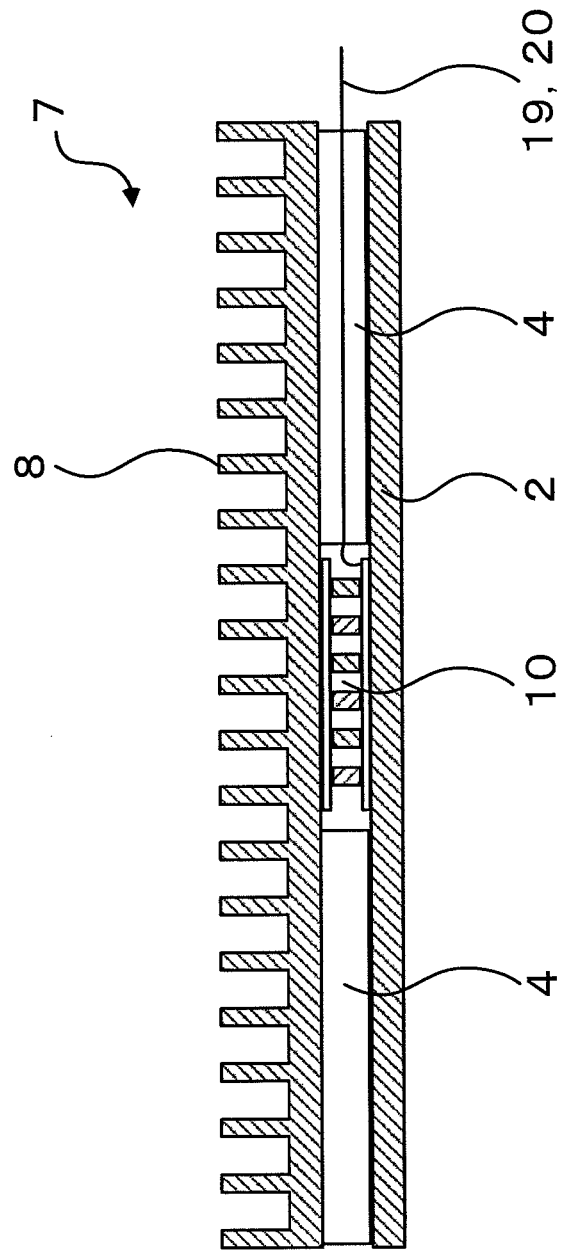
FIG. 4 is a cross sectional view of a thermoelectric conversion module according to a second embodiment.

Subsequently, a thermoelectric conversion module according to a second embodiment to which the disclosed technique is applied is described. FIG. 4 is a cross sectional view of a thermoelectric conversion module 7 according to the second embodiment. The components of thermoelectric conversion module 7 according to the second embodiment are the same as those of the thermoelectric conversion module 1 according to the first embodiment, except that the heat dissipating plate 3 is changed to a heat dissipating plate 8 having the shape illustrated in FIG. 4 compared with the thermoelectric conversion module 1 according to the first embodiment.

The heat dissipating plate 8 according to the second embodiment contains a porous sintered compact and is excellent in the heat dissipation effect because the heat dissipating plate 8 is shaped into a fin form in which a plurality of plate-like heat dissipation portions are vertically provided as illustrated in FIG. 4 to increase the front surface area. The sintered compact is one obtained by applying heat to powder to harden the same and has continuous pores. The moisture permeating into the heat insulator 4 having hydrophilicity is sucked up into the continuous pores due to capillarity to be led to the surface of the heat dissipating plate 8, and may be evaporated. Furthermore, by hydrophilizing the entire surface of the heat dissipating plate 8 including the inside of the continuous pores, the effect of sucking up moisture is increased.

The enlargement of the surface area of the heat dissipating plate for a reduction in heat resistance and an increase in evaporation area is effective for increasing the power generation output. The power generation output may be increased also by shaping the heat dissipating pate into a columnar shape by providing a column on the surface of the heat dissipating plate or forming the surface thereof into the shape of a saw by providing a plurality of grooves.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A thermoelectric conversion module, comprising:
   a first substrate having water permeability and thermal conductivity, the first substrate comprises an upper surface, a lower surface opposite the upper surface, and a plurality of first through-holes extending from the lower surface of the first substrate to the upper surface of the first substrate;
   a thermoelectric conversion element disposed on the upper surface of the first substrate, the thermoelectric conversion element being a pi type thermoelectric conversion element comprising an upper heat exchanger plate, a lower heat exchanger plate, and n-type semiconductor blocks and p-type semiconductor blocks alternately connected in series and disposed between the lower heat exchanger plate and the upper heat exchanger plate;
   a heat insulator disposed on the upper surface of the first substrate provided only around a perimeter of the thermoelectric conversion element, the heat insulator having heat insulating properties and water permeability; and
   a second substrate having water permeability and thermal conductivity disposed on the thermoelectric conversion element and the heat insulator, the second substrate comprising a lower surface, an upper surface, and a plurality of second through-holes extending from the lower surface of the second substrate to the upper surface of the second substrate,
   wherein the upper heat exchanger plate and lower heat exchanger plate are disposed between the first substrate and second substrate;
   wherein the thermoelectric conversion element and the heat insulator are disposed coplanar to each other, on the upper surface of the first substrate and below the lower surface of the second substrate, and
   wherein an entire surface of the first substrate including the upper surface of the first substrate, lower surface of the first substrate, and inner walls of the first through holes and an entire surface of the second substrate including the upper surface of the second substrate, lower surface of the second substrate, and inner walls of the second through holes are hydrophilized.

2. The thermoelectric conversion module according to claim 1, wherein the heat insulator has a continuous pore formed therein.

3. The thermoelectric conversion module according to claim 1, wherein the first substrate and the second substrate contain copper, aluminum, aluminum alloy, or graphite.

4. The thermoelectric conversion module according to claim 2, wherein an inner wall of the continuous pore has hydrophilicity.

5. The thermoelectric conversion module according to claim 1, wherein the first substrate or the second substrate is formed with a porous sintered compact, a solid body of fibers containing metal or carbon fibers, or a woven body of fibers containing metal or carbon.

6. The thermoelectric conversion module according to claim 1, wherein the heat insulator contains porous polyethylene.

7. The thermoelectric conversion module according to claim 1, wherein the second substrate has a plurality of projections or grooves formed on the surface.

8. The thermoelectric conversion module according to claim 1, wherein the thermoelectric conversion element is sealed by resin.

* * * * *